(12) United States Patent
Kristensson et al.

(10) Patent No.: US 12,314,481 B2
(45) Date of Patent: May 27, 2025

(54) BUTTON WITH MECHANICAL SWITCH, ELECTROMAGNETIC SENSOR AND HAPTIC FEEDBACK, AND METHOD

(71) Applicant: Telefonaktiebolaget LM Ericsson (publ), Stockholm (SE)

(72) Inventors: Andreas Kristensson, Södra Sandby (SE); Alexander Hunt, Tygelsjö (SE); Fredrik Dahlgren, Lund (SE)

(73) Assignee: TELEFONAKTIEBOLAGET LM ERICSSON (publ), Stockholm (SE)

( * ) Notice: Subject to any disclaimer, the term of this patent is extended or adjusted under 35 U.S.C. 154(b) by 0 days.

(21) Appl. No.: 18/280,252

(22) PCT Filed: Mar. 12, 2021

(86) PCT No.: PCT/EP2021/056430
§ 371 (c)(1),
(2) Date: Sep. 4, 2023

(87) PCT Pub. No.: WO2022/189001
PCT Pub. Date: Sep. 15, 2022

(65) Prior Publication Data
US 2024/0143086 A1    May 2, 2024

(51) Int. Cl.
*G06F 3/02* (2006.01)
*G06F 3/01* (2006.01)
(Continued)

(52) U.S. Cl.
CPC .............. *G06F 3/02* (2013.01); *G06F 3/016* (2013.01); *H03K 17/955* (2013.01); *H03K 17/962* (2013.01); *G01D 5/24* (2013.01)

(58) Field of Classification Search
CPC ......... G06F 3/02; G06F 3/016; H03K 17/955; H03K 17/962
See application file for complete search history.

(56) References Cited

U.S. PATENT DOCUMENTS

2001/0011995 A1    8/2001    Hinckley et al.
2002/0054060 A1    5/2002    Schena
(Continued)

FOREIGN PATENT DOCUMENTS

WO    2018046937 A1    3/2018

OTHER PUBLICATIONS

PCT International Search Report, mailed Feb. 18, 2022, in connection with International Application No. PCT/EP2021/056430, all pages.

(Continued)

*Primary Examiner* — Abbas I Abdulselam
(74) *Attorney, Agent, or Firm* — Leffler Intellectual Property Law, PLLC (57) ABSTRACT

A method, performed by an electronic device for triggering a function of the electronic device, wherein the electronic device comprises a button which comprises a mechanical switch actuator for triggering a function related to the button, an electromagnetic sensor for sensing touch and/or proximity of an object interacting with the button and a responsive material structure for providing haptic feedback to the object is provided. The electronic device senses touch and/or proximity of the object with the electromagnetic sensor. The electronic device generates a haptic feedback with the responsive material structure in response to sensing the touch and/or proximity of the object. The haptic feedback is associated with the function which is triggered by the mechanical switch actuator. The electronic device triggers the function in response to the mechanical switch actuator being actuated.

21 Claims, 4 Drawing Sheets

(51) Int. Cl.
    *H03K 17/955*     (2006.01)
    *H03K 17/96*     (2006.01)
    *G01D 5/24*     (2006.01)

(56) References Cited

U.S. PATENT DOCUMENTS

| | | |
|---|---|---|
| 2007/0152974 A1 | 7/2007 | Kim et al. |
| 2008/0251364 A1 | 10/2008 | Takala et al. |
| 2011/0111852 A1* | 5/2011 | Cohen .................. G07F 17/3202 463/37 |
| 2014/0267076 A1 | 9/2014 | Birnbaum et al. |
| 2016/0049265 A1 | 2/2016 | Bernstein |
| 2016/0180661 A1* | 6/2016 | Ullrich ..................... G08B 6/00 340/407.1 |
| 2016/0197608 A1* | 7/2016 | Morey ................... B60K 35/00 200/600 |
| 2016/0216763 A1 | 7/2016 | Vanhelle et al. |
| 2016/0306491 A1* | 10/2016 | Lee ........................ G06F 3/0346 |
| 2016/0306524 A1* | 10/2016 | Park ........................ G06F 1/169 |
| 2017/0280397 A1 | 9/2017 | Da Costa et al. |
| 2018/0120939 A1* | 5/2018 | Khoshkava ............. G06F 3/016 |
| 2018/0246574 A1 | 8/2018 | Modarres et al. |
| 2019/0180607 A1 | 6/2019 | Yokoyama et al. |
| 2020/0061461 A1* | 2/2020 | Mahlmeister ....... G06F 3/03547 |
| 2020/0285321 A1 | 9/2020 | Ma et al. |

OTHER PUBLICATIONS

PCT Written Opinion, mailed Feb. 18, 2022, in connection with International Application No. PCT/EP2021/056430, all pages.
Wikipedia, "Capacitive sensing", https://en.wikipedia.org/wiki/Capacitive_sensing, captured Nov. 16, 2020, 6 pages.

* cited by examiner

BUTTON WITH MECHANICAL SWITCH, ELECTROMAGNETIC SENSOR AND HAPTIC FEEDBACK, AND METHOD

TECHNICAL FIELD

The embodiments herein relate to a button, an electronic device and methods for triggering a function of the electronic device. A corresponding computer program and a computer program carrier are also disclosed.

BACKGROUND

Electronic devices, such as mobile devices, headsets, cameras, etc., may each comprise physical buttons that are tied to specific functions or functionality in the respective device. A user of these devices may learn the functionality of the buttons by reading the device manual and/or by looking at icons and/or text engraved or embossed or printed on said buttons.

If a physical button of the electronic device is not in direct line of sight, e.g., by being located on a headset being worn by the user, and if there are more than one button closely located on said headset, said user may need to use his or hers fingers to sense an area around the buttons to make sure the right button is being used. This may be cumbersome to the user and may result in the user interacting with a button which the user didn't intend to interact with. In the end the power consumption of the electronic device may be increased.

Furthermore, if a device is not used that often the user might forget about the functionality and placement of the physical buttons and need to relearn.

Electronic devices may also comprise one or more physical buttons respectively tied to more than one specific function or functionality in the electronic device.

This may create an ambiguity for the user regarding which function relates to a specific button at a specific time. This is especially true for mobile devices with very few buttons so that each button has multiple functions depending on which application is currently being used.

Some prior art physical buttons support audible and/or visual feedback cues being provided to the user. One example is volume up and volume down physical buttons on a mobile device that affects the volume in a music player application but could also affect camera zoom level in the camera application depending on which application is currently being used. If the user is currently using the camera application, it is apparent (visually as the camera is currently the active application) to said user that the buttons correspond to zoom in zoom out. If the user listens to music in the music player application, it is apparent (audibly and visually if the user looks at the application being displayed on the device) to said user that the buttons correspond to volume up volume down.

As described above physical buttons may require direct line of sight and/or visual and/or audible feedback cues for quick and confident device operations, such as user interface operations.

However, audible feedback cues are typically overlayed on existing content, e.g., if music is being listened to the cues may be overlayed on said music and thereby interrupts or disturbs the content being listened to.

Visual feedback cues could be displayed on said buttons or on a related device display. However, visual feedback cues require line of sight. Further, as for the audible feedback cues, also the visual feedback cues may disturb the content of the display. Furthermore, the power consumption related to displaying visual cues may be considerable.

SUMMARY

An object of embodiments herein may be to obviate some of the problems related to handling of physical buttons on electronic devices, or at least reduce the impact of them.

According to an aspect, the object is achieved by a button. The button comprises a mechanical switch actuator for triggering a function related to the button, an electromagnetic sensor for sensing touch and/or proximity of an object interacting with the button and a responsive material structure for providing haptic feedback to the object.

According to a further aspect, the object is achieved by method, performed by an electronic device for triggering a function of the electronic device. The electronic device comprises a button which comprises a mechanical switch actuator for triggering the function related to the button, an electromagnetic sensor for sensing touch and/or proximity of an object interacting with the button and a responsive material structure for providing haptic feedback to the object. The electronic device senses touch and/or proximity of the object with the electromagnetic sensor. The electronic device generates a haptic feedback with the responsive material structure in response to sensing the touch and/or proximity of the object. The haptic feedback is associated with the function which is triggered by the mechanical switch actuator. The electronic device triggers the function in response to the mechanical switch actuator being actuated.

According to yet a further aspect, the object is achieved by an electronic device. The electronic device comprises a button for the electronic device. The button comprises a mechanical switch actuator for triggering a function related to the button, an electromagnetic sensor for sensing touch and/or proximity of an object interacting with the button and a responsive material structure for providing haptic feedback to the object. The electronic device is configured to:

sense touch and/or proximity of an object with the electromagnetic sensor;

generate a haptic feedback with the responsive material structure in response to sensing the touch and/or proximity of the object, wherein the haptic feedback is associated with a function which is triggered by the mechanical switch actuator; and trigger the function in response to the mechanical switch actuator being actuated.

According to a further aspect, the object is achieved by a computer program comprising instructions, which when executed by a processor, causes the processor to perform actions according to any of the aspects above.

According to a further aspect, the object is achieved by a carrier comprising the computer program of the aspect above, wherein the carrier is one of an electronic signal, an optical signal, an electromagnetic signal, a magnetic signal, an electric signal, a radio signal, a microwave signal, or a computer-readable storage medium.

Since the button comprises the mechanical switch actuator for triggering the function related to the button, the electromagnetic sensor for sensing touch and/or proximity of the object interacting with the button and the responsive material structure for providing haptic feedback to the object, uncertainty regarding which function that will be triggered at a button press is reduced or eliminated.

Since the electronic device comprising the button generates the haptic feedback associated with the function which is triggered by the mechanical switch actuator, with the responsive material structure in response to sensing the touch and/or proximity of the object, the electronic device is able to unambiguously indicate to a user of the device which function that will be performed by actuating the mechanical switch actuator. Further, since the electronic device operates the button based on multiple activation stages (1. sensing touch and/or proximity of the object, and 2. performing the function in response to the mechanical switch actuator being actuated) the electronic device is able to trigger more functions based on a few physical buttons while providing function specific feedback to the user.

A further advantage of embodiments herein is that they do not require line of sight for providing visual feedback cues.

A further advantage of embodiments herein is that the haptic feedback doesn't disturb content being consumed by the user.

A further advantage of embodiments herein is that the power consumption is low.

BRIEF DESCRIPTION OF THE DRAWINGS

In the figures, features that appear in some embodiments are indicated by dashed lines.

The various aspects of embodiments disclosed herein, including particular features and advantages thereof, will be readily understood from the following detailed description and the accompanying drawings, in which.

DETAILED DESCRIPTION

Figure 1:
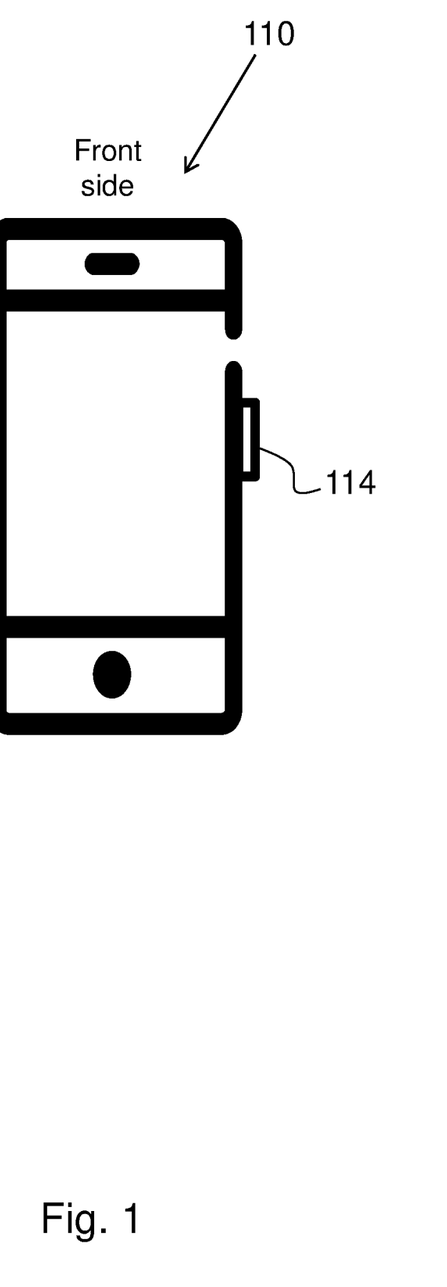
FIG. 1 illustrates exemplifying embodiments of an electronic device.

Embodiments herein relate to electronic devices and their physical buttons in general. FIG. 1 depicts an electronic device 110 wherein embodiments herein may be implemented. The electronic device 110 may be or comprise any of a mobile phone, a tablet, a TV, a monitor, a headset, electronic eyewear, an alarm clock, a car, or a stereo. In FIG. 1 the electronic device is illustrated with a front side of a mobile phone.

The electronic device 110 comprises one or more physical buttons. The one or more physical buttons may be more or less visually obstructed, e.g., arranged on a surface of the electronic device 110 which usually is not visible when operating the electronic device 110. As an example, in FIG. 2 a first button 211, a second button 212 and a third button 213 are arranged on a backside of the electronic device 110. The electronic device 110 may in some embodiments comprise a display, e.g., on the front side. The display may take up a large part, or even all, of the front side and therefore it may be disadvantageous to arrange physical buttons on the front side.

Figure 2:
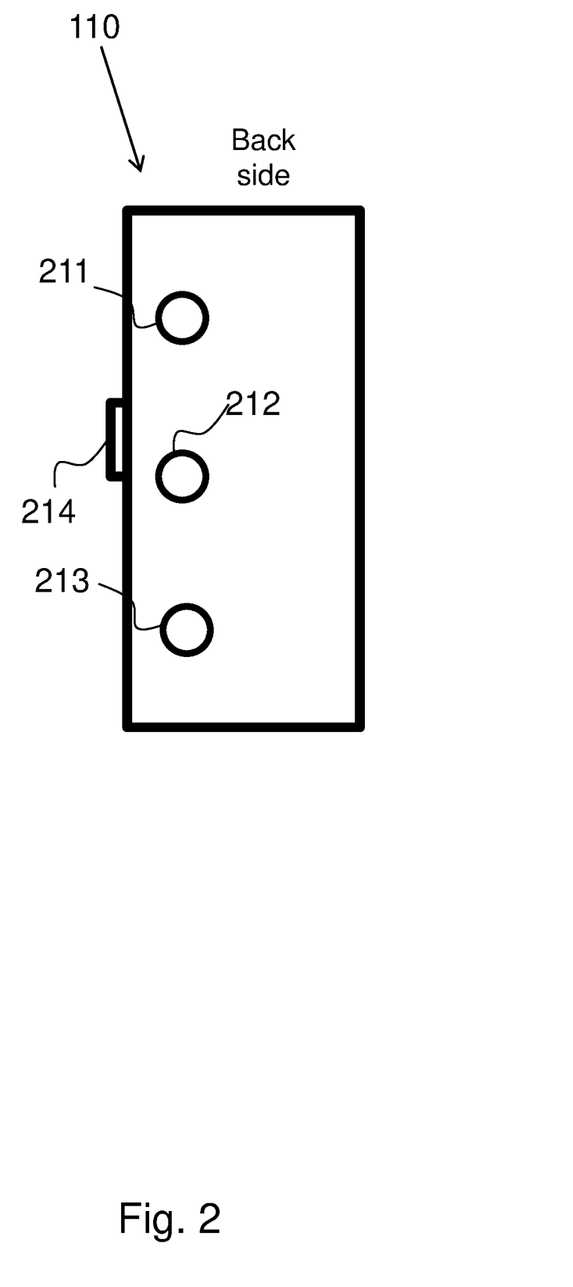
FIG. 2 illustrates further exemplifying embodiments of the electronic device.

In other embodiments a fourth button 114, 214 is arranged on the electronic device 110 such that not the entire fourth button 114, 214 is visible, e.g., when viewing the front side. The fourth button 114 may, e.g., be arranged on a side surface of the electronic device 110.

As mentioned above, if a physical button 211, 212, 213, 214 of the electronic device 110 is not in direct line of sight, e.g., by being located on a headset being worn by a user, and if there are more than one button closely located, said user may need to use his or hers fingers to sense an area around the buttons to make sure the right button is being used. This may be cumbersome to the user and may result in the user interacting with a button which the user didn't intend to interact with. In the end the power consumption of the electronic device may be increased.

Embodiments herein seek to reduce at least some of the problems described above and are directed to a low-power smart-material button. As will be detailed below, the button 211, 212, 213, 214 may revolve through many states as it may have more than one activation stage. The multi-activation combined with the haptic material enables mapping more functions on a few physical buttons at one specific context or mode of the electronic device 110, while providing function specific haptic cue to the user before pressing the button 211, 212, 213, 214 in order to eliminate uncertainty on which function would be triggered by pressing the button.

Figure 3:
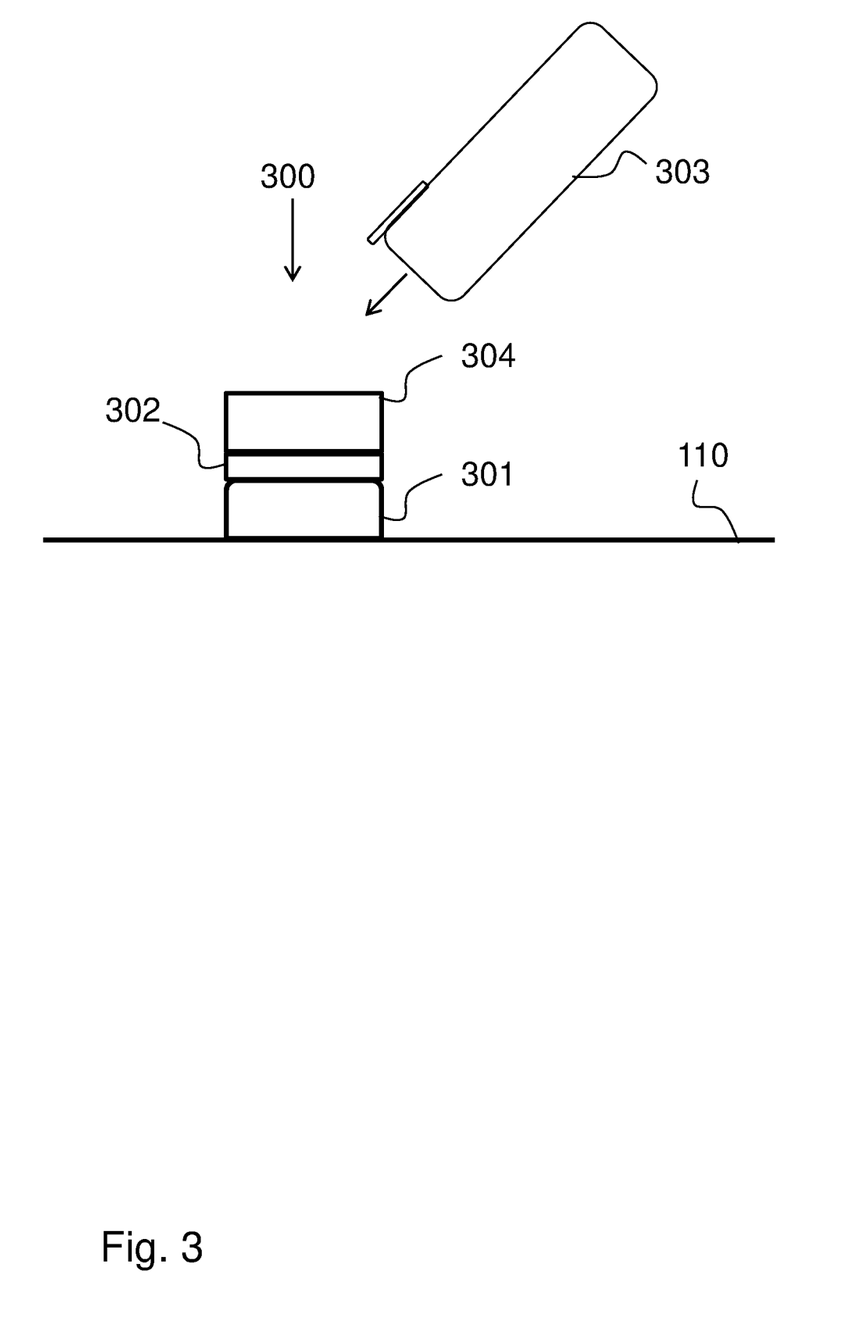
FIG. 3 illustrates exemplifying embodiments of a button.

FIG. 3 depicts a button 300 for the electronic device 110 according to embodiments herein. The button 300 may be arranged on the electronic device 110. The button 300 comprises a mechanical switch actuator 301 for triggering a function related to the button. The button further comprises an electromagnetic sensor 302 for sensing touch and/or proximity of an object 303 interacting with the button 300. The button 300 also comprises a responsive material structure 304 for providing haptic feedback to the object 303 interacting with the button 300. The haptic feedback may be associated with the function which is triggered by the mechanical switch actuator 301. The object 303 may be a part of a user, such as a finger, or part of a finger.

The mechanical switch actuator 301 may comprise a collapsible mechanical structure. For example, the mechanical switch actuator 301 may comprise a dome switch actuator. Such mechanical switches provide both tactile feedback and function activation in a single button. For example, the mechanical switch actuator 301 may provide push haptic sensation and function activation. The activation of the function is triggered by a collapse of the mechanical switch actuator 301 due to a physical press, e.g., by the user.

The electromagnetic sensor 302 may be a capacitive sensor.

The electromagnetic sensor 302 allows to sense when the object 303 is touching or nearby the physical button 300. The electromagnetic sensor 302 may be activated with zero-force touch. That is, the electromagnetic sensor 302 may detect zero-force-touch. A zero-force touch sensor is able to register a touch without pressure and convert that touch into an electrical output that initiates an operation or a function. As will be described in more detail below in relation to FIG. 4, in embodiments herein, initiating the operation or the function may comprise controlling, by e.g., activating or triggering, a state of the button 300 which is related to a function that can be performed by the electronic device 110 by activating the mechanical switch actuator 301 and which may be indicated to the user with the haptic feedback. For example, a tap of the button 300, may change the function of the button 300 and thereby change the related haptics. This will be further described below when describing action 402.

In some embodiments herein the electromagnetic sensor 302 is arranged between the mechanical switch actuator 301 and the responsive material structure 304.

In some further embodiments herein the button 300 comprises a layered structure and the electromagnetic sensor 302 is comprised in a second layer arranged between a first layer comprising the mechanical switch actuator 301 and a third layer comprising the responsive material structure 304.

In some further embodiments herein the electromagnetic sensor 302 is at least partly not covered by a conductive material. For example, a capacitive sensing region of the capacitive sensor may not be covered fully by a conductive material. Thus, in some embodiments herein the electromagnetic sensor 302 is at least partly not covered by a conductive material on a sensing side of the electromagnetic sensor 302.

The responsive material structure 304 for providing haptic feedback may be one of an electroactive material structure, a photomechanical material structure and a heat activated material structure. The electroactive material structure may comprise an electroactive polymer (EAP). A typical characteristic property of an EAP is that they will undergo a large amount of deformation while sustaining large forces.

The responsive material may also be called smart material, and/or intelligent material. Such materials may be designed materials that have one or more properties that can be significantly changed in a controlled fashion by external stimuli, such as stress, moisture, electric or magnetic fields, light, temperature, pH, or chemical compounds.

In some embodiments herein light is used to activate a photomechanical material. For example, a Light-Emitting Diode (LED) may be integrated in the mechanical switch actuator 301. When light from the LED is activated it will also activate the photomechanical material. The LED may be activated based on the sensed touch and/or proximity of the object with the electromagnetic sensor 302. For example, there may be a power management unit (PMU) or a light management unit (LMU) that controls the LED. The LED may be electrically connected to the PMU or the LMU and ground. In another embodiment the LED may be electrically connected to the PMU or the LMU and a common electrical connection for multiple LEDs back to the PMU/LMU.

In some other embodiments herein the electromagnetic sensor 302 comprises a photo sensor close to the LED which is arranged and configured to detect light changes. When the object 303, such as a finger, approaches the button 300 the light will reflect on the object 303 and the photodiode will detect changes in the detected light due to changes in the reflection from the object 303 and proximity may be sensed in that way.

In embodiments herein the responsive material structure 304 may be triggered to change a property, such as its size and/or shape, by an output from the electromagnetic sensor 302. The change of the property may be dependent on an associated function to be activated by the mechanical switch actuator 301. The associated function may in some embodiments herein be determined by the output from the electromagnetic sensor 302.

Smart materials may be the basis of many applications, including sensors and actuators, or artificial muscles, particularly as electroactive polymers.

Terms used to describe smart materials include shape memory material (SMM) and shape memory technology (SMT).

In embodiments herein the responsive material structure 304 generates physical haptic patterns which can be identified and differentiated by a user.

The haptic feedback may comprise a mechanical deformation of the responsive material structure 304. For example, the mechanical deformation may be triggered by an output from the electromagnetic sensor 302 and may be dependent on an associated function to be triggered by the mechanical switch actuator 301. The associated function may in some embodiments herein be determined by the output from the electromagnetic sensor 302.

In some embodiments herein the responsive material structure 304 is arranged or configured such that it is responsive to sensing the touch and/or proximity of the object 303 in relation to the button 300. For example, the responsive material structure 304 may be electrically connected to the electromagnetic sensor 302.

Figure 4:
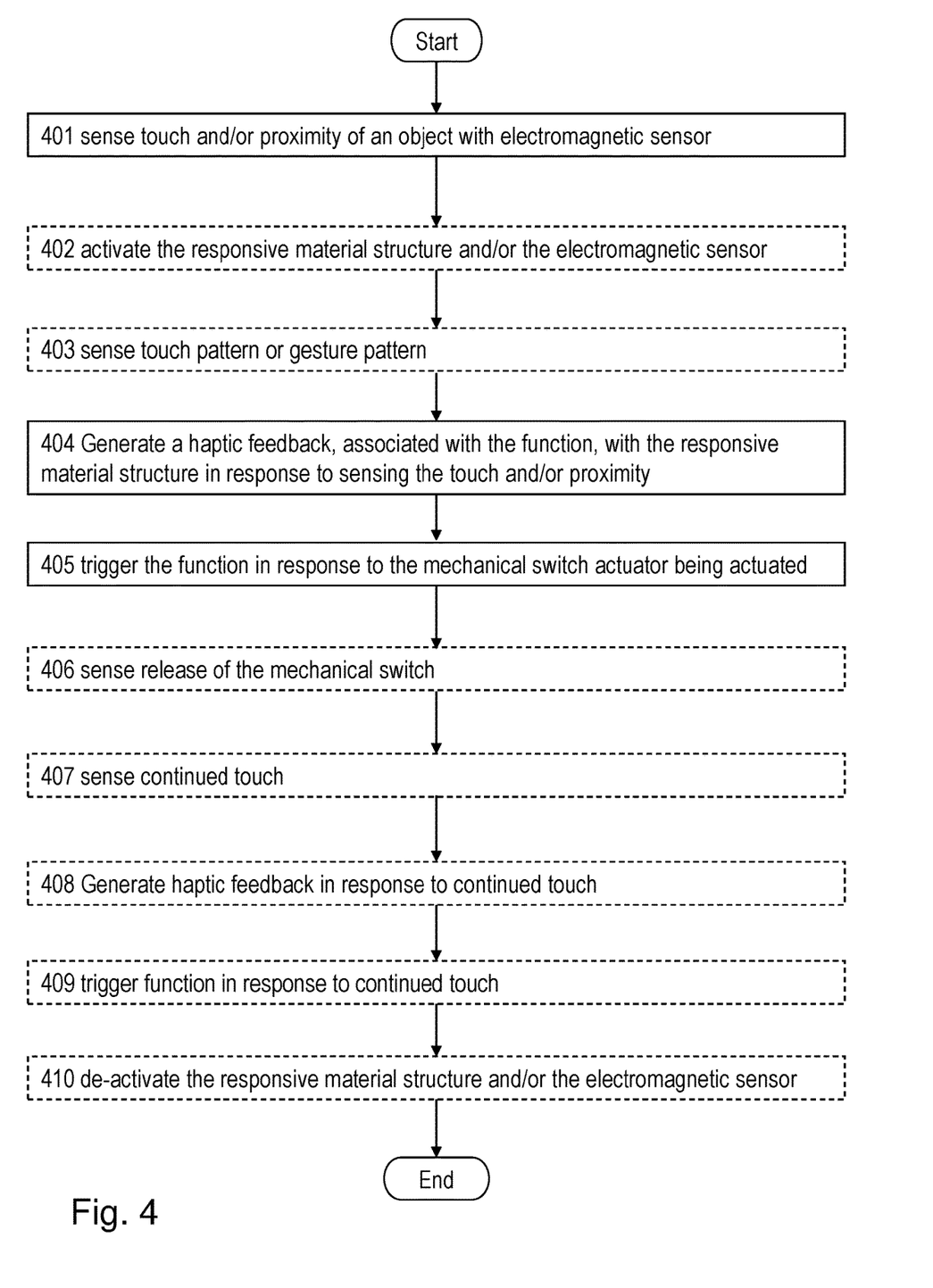
FIG. 4 is a flowchart illustrating embodiments of a method performed by an electronic device.

Exemplifying embodiments herein will now be described with reference to FIG. 4 and with further reference to FIGS. 1, 2 and 3. FIG. 4 illustrates a flowchart describing a method, performed by the electronic device 110, for actuation of the function of the electronic device 110.

As mentioned above, the electronic device 110 comprises the button 300 which comprises the mechanical switch actuator 301 for triggering the function related to the button 300. The electronic device 110 further comprises the electromagnetic sensor 302 for sensing touch and/or proximity of the object 303 and the responsive material structure 304 for providing haptic feedback to the object 303 interacting with the button 300.

One or more of the following actions presented in FIG. 4 may be performed in the following exemplifying order. In other examples, the order may differ from what is described below.

Action 401

The electronic device 110 senses touch and/or proximity of the object 303 with the electromagnetic sensor 302. For example, the electronic device 110 may sense a touch and/or proximity of a finger of a user of the electronic device 110.

Action 402

In some embodiments herein the electronic device 110 activates the responsive material structure 304 and/or the electromagnetic sensor 302 in response to sensing touch and/or proximity of the object 303 with the electromagnetic sensor 302. Activating the responsive material structure 304 may comprise activating a high-power mode of the responsive material structure 304. In some embodiments herein the responsive material structure 304 is configured to generate the haptic feedback in the high-power mode while it is configured to not generate the haptic feedback in a low-power mode, i.e., before the activation.

Activating the electromagnetic sensor 302 may comprise activating the electromagnetic sensor 302 to detect zero-force touch in response to sensing proximity of the object 303.

Activating the electromagnetic sensor 302 may further comprise activating a state of the button 303. The state may be activated by selection, e.g., by changing state from a current state. The state of the button may be associated with a function that can be triggered by interaction with the button 300. For example, activating the state may comprise selecting or changing a function associated with the button 303. Thus, the electromagnetic sensor 302 may control the function of the button 300 based on the interaction with it. The function may then be triggered by the mechanical switch actuator 304. For example, performing the function may be triggered by the mechanical switch actuator 304.

Activating the state of the button 300, e.g., with a tap of the button 300, may change the function of the button 300 and thereby change the related haptics. The haptics may be dependent on the activation of the electromagnetic sensor 302. For example, the haptic feedback may be dependent on how the electromagnetic sensor 302 is activated and the history of the sensed touch. This will be described in more detail below after the description of FIG. 4 by some exemplifying embodiments. In short, in some embodiments herein multiple functions of the electronic device 110 may be handled by the button 300 by iterating through the various functions by sensing touch with the electromagnetic sensor 302 and rendering related cues as haptic patterns with the responsive material structure 304.

In some other embodiments herein, some functions may be triggered by interaction with the electromagnetic sensor 302 while other functions are triggered by the mechanical switch actuator 304. Thus, in some embodiments some haptic feedback is associated with functions triggered by the electromagnetic sensor 302, while other haptic feedback is associated with functions triggered by the mechanical switch actuator 304.

Activating the electromagnetic sensor 302 may further comprise activating a more sensitive detection of touch and/or proximity and/or movement, such as gestures. For example, activating the electromagnetic sensor 302 may comprise changing sensor settings such as frequency of scans, signal strength and signal threshold.

In some embodiments herein the activation is conditioned. For example, the electronic device 110 may activate the responsive material structure 304 and/or the electromagnetic sensor 302 in response to sensing touch and/or proximity of the object 303 with the electromagnetic sensor 302 if the button 300 is configured to initiate the performing of the function in the context in which the electronic device 110 is used. In other words, the electronic device 110 may activate the responsive material structure 304 and/or the electromagnetic sensor 302 in response to sensing touch and/or proximity of the object 303 if the button 300 is configured to activate a function in the current context. For example, if the electronic device 110 is a mobile phone the button 300 may be configured to activate a certain function, such as a camera function, when the mobile phone is in a camera mode, while the same button may have no function tied to it when the camera is in a phone mode. In this way power may be saved since the button 300 consumes less power than if it was active all the time.

An advantage of activating the responsive material structure 304 and/or the electromagnetic sensor 302 in response to sensing touch and/or proximity of the object 303 is that the power consumption of the electronic device 110 is reduced compared to if the responsive material structure 304 and/or the electromagnetic sensor 302 were active all the time.

Action 403

The electronic device 110 may then sense patterns of touch and/or proximity. For example, the electronic device 110 may activate the electromagnetic sensor 302 such that it is configured to sense patterns of touch and/or proximity. As described above in action 402 the activation may be in response to sensing touch and/or proximity of the object 303.

In some embodiments herein these patterns are used to explore multiple functions associated with the button 300. For example, the electronic device 110 may toggle through the multiple functions in response to sensing different patterns and then generate specific haptic feedback based on the sensed pattern.

The generation of the haptic feedback is described in more detail below in action 404. The electronic device 110 may then select a function to perform out of the multiple functions associated with the button 300 based on the pattern that was sensed before the mechanical switch actuator 301 was actuated. Actuation of the mechanical switch actuator 301 is described in more detail below in action 405.

In some embodiments herein the electromagnetic sensor 302 triggers different functions of the mechanical switch actuator 304 based on a sensed touch pattern. For example, the electromagnetic sensor 302 may, based on the sensed touch pattern, simulate different buttons associated with a music player (play, skip, FF, RW, pause etc) and select the associated function. A zero-force touch may be sensed to change function, and a force press may actuate the mechanical switch actuator 304 to activate the same function.

Action 404

The electronic device 110 generates a haptic feedback with the responsive material structure 304 in response to sensing the touch and/or proximity of the object 303. The haptic feedback is associated with a function to be performed by the electronic device 110, which function is activated by the mechanical switch actuator 301. As mentioned above, in some embodiments some haptic feedback is associated with functions triggered or activated by the electromagnetic sensor 302, while other haptic feedback is associated with functions triggered or activated by the mechanical switch actuator 304.

Since the haptic feedback is generated in response to sensing the touch and/or proximity of the object 303 the haptic feedback may be generated before the function is activated in order to inform the user of which function is going to be activated by the activation of the mechanical switch actuator 301. This allows for more functions to be activated by one button.

A further advantage of embodiments herein is that they don't require line of sight for providing feedback cues.

A yet further advantage of embodiments herein is that the haptic feedback doesn't disturb content being consumed by the user.

In some embodiments herein generating the haptic feedback is based on sensing a touch pattern or a movement pattern of the object 303 with the electromagnetic sensor 302. The movement pattern may comprise a gesture pattern.

For example, generating the haptic feedback may be based on sensing a length of the touch pattern or the movement pattern, or a reference touch pattern or movement pattern, or a count of reference touch patterns or movement patterns. The movement pattern may be a movement pattern in proximity of the buttons 211-214. For example, moving towards the respective button 211-214 or moving from one button 211 towards another button 212.

Generating the haptic feedback may further be based on a context in which the electronic device 110 is used. The context may comprise a software application running on the electronic device 110 and/or a mode of the electronic device 110.

In some embodiments herein when the function comprises adjusting an input parameter of the electronic device 110 the haptic feedback may be dependent on a value of the input parameter. For example, when adjusting a volume, a continuous press of the mechanical switch actuator 301 may successively adjust a volume level and the haptic feedback is changed accordingly—so the haptic feedback may depend on the actual value or level of the volume being changed. The haptic feedback may be implemented as pulses in the responsive material structure 304 where the frequency of the pulses depends on the current volume.

The haptic feedback may be further based on temperature and/or whether conditions.

Action 405

In some embodiments herein the electronic device 110 performs the function in response to the mechanical switch actuator 301 being actuated. In some embodiments herein the mechanical switch actuator 301 is actuated after the responsive material structure 304 generates the haptic feedback.

Action 406

In order to sense further inputs and activate further functions with the same button 300 the electronic device 110 may sense a release of the mechanical switch actuator 301.

Action 407

According to some embodiments herein the electronic device 110 may sense a continued touch of the object with the electromagnetic sensor 302 also after the electronic device 110 has sensed the release of the mechanical switch actuator 301.

For example, in some embodiments herein wherein the electronic device 110 performs a first function in response to the mechanical switch actuator 301 being actuated and the method further comprises sensing the release of the mechanical switch actuator 301 described above in action 406, then the electronic device 110 senses the continued touch of the object 303 with the electromagnetic sensor 302 in order to perform further functions with the same button 300. For example, the first function may be performed again in response to the sensing of the continued touch. For such embodiments the electronic device 110 may generate the haptic feedback corresponding to the first function again in response to the continued touch.

Action 408

When the first function is performed again in response to sensing the continued touch the electronic device 110 may generate the haptic feedback corresponding to the first function again in response to the continued touch.

Action 409

As mentioned above, the electronic device 110 may perform further functions with the same button 300 also after the release of the button 300.

In some embodiments the electronic device 110 triggers the first function again in response to sensing the continued touch.

Action 410

It may be important to turn off the electroactive material structure 304 when not used, e.g., after some duration, in order to save power.

Therefore, in some embodiments herein the electronic device 110 de-activates the responsive material structure 304 and/or the electromagnetic sensor 302 in response to not sensing touch and/or proximity of the object 303 with the electromagnetic sensor 302 during a time period.

FURTHER DETAILED EXAMPLES

In some embodiments the button 300, such as a low-power smart-material physical button, renders cue related to the function of the button 300 as a haptic pattern on the smart-material layer when the user finger is nearby or touching said button 300.

Example

1. The user places its finger on button 300 or in proximity of the button 300.
2. the electromagnetic sensor 302 senses the finger and generates a haptic cue with the responsive material structure 304 for a function being represented by said button 300.
3. If the user pushes the button 300 the function related to the button 300 will be initiated by the mechanical switch actuator 301. That is the actuation of the mechanical switch actuator 301 initiates the function.
4. The user removes its finger and the responsive material structure 304 stops generating the haptic cue. That is, the electronic device 110 senses a removal of the object 303, such as the finger, and stops generating the haptic cue.

The button only generates haptic cues on the responsive material structure 304 once a finger is nearby or touching said button 300 which reduces power consumption. Thus, the power consumption is controlled by sensing touch and/or proximity.

Furthermore, in some embodiments herein, the responsive material structure 304 and any associated driving circuit is in the low-power mode until the finger is touching or near the button as indicated by the electromagnetic sensor 302, such as the capacitive sensor.

In some alternative embodiments the button 300 is configured to handle multiple functions of the electronic device 110 by iterating through the various functions and rendering related cues as haptic patterns with the responsive material structure 304. Once a requested function is recognized by the user the user follows through with a physical push on the button 300 so as to select the function. Example:

1. The user places its finger on the button 300 or in proximity of the button 300.
2. The electromagnetic sensor 302 senses the finger and generates a first haptic cue with the responsive material structure 304 for a first function being represented by said button 300.
3. Further different cues may be generated based on the below examples:
    a. If the electronic device 110 senses a continued touch on the button 300 while not sensing an actuation of the mechanical switch actuator 301 (e.g., if the user keeps its finger on the button 300 without pressing said button 300) the responsive material structure 304 will after some time generate a new second haptic cue for a second function being represented by said button 300. This may be repeated for all functions handled by said button 300. If no function is selected by the user, i.e., activated by the actuation of the mechanical switch actuator 301, then the first haptic cue will be generated again according to the above. The time period between the first haptic cue and the second haptic cue may be defined in seconds and may be preset or set by a user setting.
    b. If the electronic device 110 senses a tap (e.g., with a finger) on the button 300 without physically pressing said button it will generate the new second haptic cue for the second function being represented by said button. If no function is selected by the user, i.e., activated by the actuation of the mechanical switch actuator 301, then the first haptic cue will be generated again according to the above.
    c. Instead of sensing a tapping finger as in example b above, the electronic device 110 senses a removal of the finger and then a touch of the finger on or near the button within a predefined short time period in order for the next function to be presented by its related haptic cue.
4. If the user pushes the button 300 the function related to the current haptic cue will be initiated. That is the actuation of the mechanical switch actuator 301 initiates the function related to the current haptic cue.

5. The user removes its finger and the responsive material structure 304 stops generating the haptic cue.

In some further alternative embodiments, the electronic device 110 will initiate a same function as an initial function associated with a first actuation of the mechanical switch actuator 301 if one or more further actuations of the mechanical switch actuator 301 are performed within a limited period of time from the first actuation. The limited time period between two actuations may be defined in seconds and may be preset or set by a user setting. One use case where this would make sense is e.g., volume functionality where more than one button actuation sometimes is required to get to the desired volume level. Example:

1. The user places its finger on the button 300 or in proximity of the button 300.
2. The electronic device 110 senses the finger and generates a first haptic cue for a first function being represented by the button 300.
3. Further different cues may be generated based on the examples described above.
4. If the user pushes the button 300 the function related to the current haptic cue will be initiated. That is, the actuation of the mechanical switch actuator 301 initiates the function related to the current haptic cue.
5. The user removes its finger and the responsive material structure 304 stops generating the haptic cue.
6. If the user pushes the button 300 again after some time such that the mechanical switch actuator 301 is actuated again, the same function as initiated in step 4 above will again be initiated. If the user hasn't pushed again after some time, i.e., if the mechanical switch actuator 301 hasn't been actuated after some time, a next actuation of the mechanical switch actuator 301 will fall into sequence again at step 1.

In some alternative embodiments the button 300 will initiate the same function as the initial function from the first push of the button 300 if the electronic device 110 senses a continued touch of the button 300 after the mechanical switch actuator 301 has been actuated and released.

In yet some alternative embodiments the electronic device 110 will cancel and/or undo and/or reverse the function related to the current haptic cue being generated if the user performs a long press on the button 300, i.e., if the electronic device 110 senses a long actuation of the mechanical switch actuator 301.

In yet some further alternative embodiments the haptic pattern is dependent on temperature or weather data. For example, the electronic device 110 may use temperature sensor(s) and/or weather information from e.g., the electronic device 110, a network, and/or Internet to understand if a haptic pattern better suited to the current temperature or weather conditions are to be generated. One example is cold weather where a clearer and/or stronger haptic cue pattern may be useful as fingers may have difficulties sensing the haptic cues.

In yet some other embodiments, the electronic device 110 comprises a specific mode-button, such as the fourth button 114, 214, with a distinct haptic cue, that changes the function of the other buttons 211, 212, 213 and hence their corresponding haptic cue. In one example use case, the other buttons 211, 212, 213 have functions related to an active application running on the electronic device 110. Those functions may be rendered by corresponding haptic cues on the other buttons 211, 212, 213, and the specific mode-button 114, 214 changes the function of the other buttons 211, 212, 213 to instead have functions related to the electronic device 110 or the navigation between applications. Since the function of each button 211, 212, 213, 214 has its own distinct haptic function, it is easy for the user to distinguish whether the buttons 211, 212, 213, 214 and their associated functions are associated to the application or the electronic device 110 without having to look at the buttons 211, 212, 213, 214. This may be useful for example with buttons 211, 212, 213, 214 placed on a headset.

In yet some other embodiments, to further save power consumption while enabling a more intuitive user interface, only buttons having an active function in the current mode of the electronic device 110 are enabled to render a haptic cue when a finger touches or comes close to the button 300, otherwise the buttons remain in deep sleep. This means that more buttons can be added for a potentially more rich or intuitive interface in e.g., a headset, without an increased ambiguity of which function is mapped to which button. Further, power consumption is not wasted on buttons not having an active function. If the user feels that there is a button but there is no haptic cue, that user will understand that the button is inactive and has no function when pressed. That is, the electronic device 110 may indicate that it is inactive by not generating any haptic cue.

In yet another embodiment, for buttons where a duration of a press has a meaning, this can be adaptively indicated by the haptic cue. That is, generating the haptic feedback may be dependent on a duration of the actuation of the mechanical switch actuator 301. As described above in relation to action 404, for such embodiments generating the haptic feedback may be dependent on the value of the input parameter of the electronic device 110 which is adjusted by the function that is activated by actuation of the mechanical switch actuator 301. That is, there may be a relation between the duration of the press and the value of the input parameter being adjusted, such as the volume of a headset.

For example, for a volume-up button 300, the haptic cue may be an upwards-directed wave. As the button 300 is held down to continuously actuate the mechanical switch actuator 301 and to increase the volume higher and higher, the frequency of the haptic cue increases. The frequency may increase from e.g., 1 Hz to several Hz. One use case is to increase or reduce the volume of a headset also when there is no playback audio. Then the electronic device 110 indicates, e.g., to a user, how much higher or lower the volume has been set by generating the haptic feedback.

The same button 300 may also have an alternative function, e.g., to what extent the headphone should be transparent to outside sound. That function may then have an alternative haptic cue associated to the alternative function. The frequency of the alternative haptic cue may also increase or decrease as the input parameter of the electronic device 110 is adjusted, e.g., by actuation of the mechanical switch actuator 301. In other words, the frequency of the alternative haptic cue may also increase or decrease as the user changes it gradually up or down.

The mapping of different functions onto the same button 300 in this example may be performed by letting the button 300 revolve through many states as presented above, and/or by the mode button, and/or by other methods.

According to some embodiments above a low-power layered physical button 300 has been disclosed. One layer handles touch and/or proximity sensing which triggers feedback cue generation via haptic patterns on the responsive material layer once an object, such as a finger, is touching or nearby the physical button 300.

Further, some embodiments above disclose multistage activation of the physical button 300 by sensing proximity and/or zero force touch and physical press.

Figure 5:
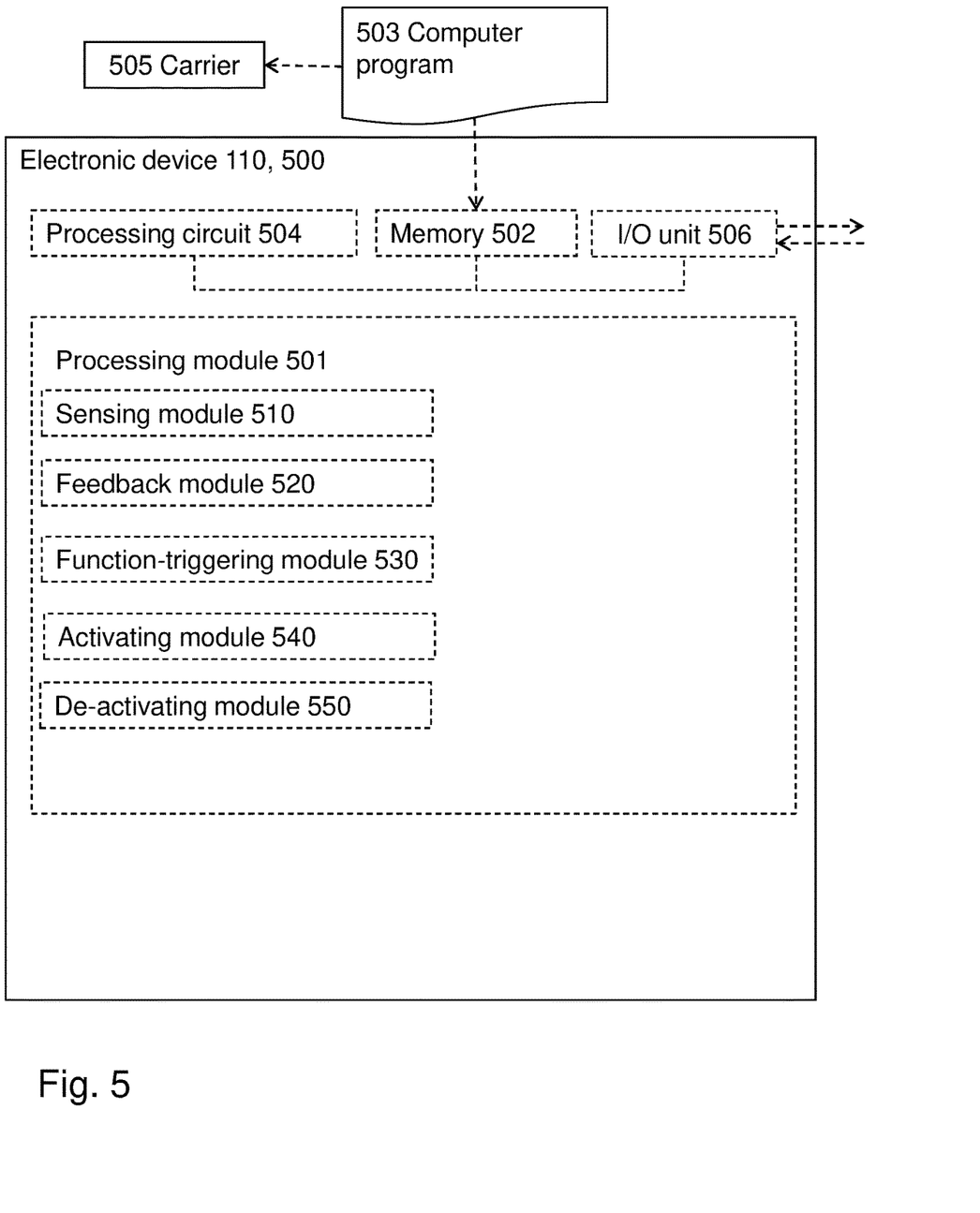
FIG. 5 is a block diagram illustrating embodiments of the electronic device.

FIG. 5 illustrates a schematic block diagram of embodiments of the electronic device 110, 500.

The electronic device 110, 500 may comprise a processing module 501 for performing the above method actions. The processing module 501 may comprise a sensing module 510 to, e.g., sense touch and/or proximity of an object 303 interacting with the button 300. The processing module 501 may comprise a feedback module 520 to, e.g., provide haptic feedback to the object 303. The processing module 501 may comprise a function-triggering module 530 to, e.g., trigger a function related to the button 300 and/or trigger the function in response to the mechanical switch actuator 301 being actuated. The processing module 501 may comprise an activating module 540 to, e.g., activate the responsive material structure 304 and/or the electromagnetic sensor 302. The processing module 501 may comprise a de-activating module 550 to, e.g., de-activate the responsive material structure 304 and/or the electromagnetic sensor 302.

To perform the actions 401-410 above, the electronic device 110, 500 comprises the button 300. The button 300 comprises a mechanical switch actuator 301 for triggering a function related to the button, an electromagnetic sensor 302 for sensing touch and/or proximity of an object 303 interacting with the button 300 and a responsive material structure 304 for providing haptic feedback to the object 303.

The electronic device 110, 500 may further be configured to, e.g., by means of the sensing module 510, sense touch and/or proximity of an object 303 with the electromagnetic sensor 302.

The electronic device 110, 500 may further be configured to, e.g., by means of the feedback module 520, generate a haptic feedback with the responsive material structure 304 in response to sensing the touch and/or proximity of the object 303, wherein the haptic feedback is associated with a function which is triggered, e.g., by means of the function-triggering module 530, by the mechanical switch actuator 301.

The electronic device 110, 500 may further be configured to, e.g., by means of the feedback module 520, generate the haptic feedback based on a context in which the electronic device 110, 500 is used.

The electronic device 110, 500 may further be configured to, e.g., by means of the function-triggering module 530, trigger the function in response to the mechanical switch actuator 301 being actuated.

The electronic device 110, 500 may further be configured to, e.g., by means of the activating module 540, activate the responsive material structure 304 and/or the electromagnetic sensor 302 in response to, e.g., by means of the sensing module 510, sensing touch and/or proximity of the object with the electromagnetic sensor 302.

The electronic device 110, 500 may further be configured to, e.g., by means of the activating module 540, activate the responsive material structure 304 and/or the electromagnetic sensor 303 in response to, e.g., by means of the sensing module 510, sensing touch and/or proximity of the object with the electromagnetic sensor 302 if the button 300 is configured to trigger the function in the context in which the electronic device 110, 500 is used.

The electronic device 110, 500 may further be configured to, e.g., by means of the de-activating module 550, de-activate the responsive material structure 304 and/or the electromagnetic sensor 302 in response to not sensing touch and/or proximity of the object 303 with the electromagnetic sensor 302 during a time period.

In some embodiments, the function comprises adjusting an input parameter of the electronic device 300 and wherein the haptic feedback is dependent on a value of the input parameter.

In some embodiments, generating the haptic feedback, e.g., by means of the feedback module 520, is adapted to be based on sensing the touch pattern or the movement pattern of the object 303 with the electromagnetic sensor 302.

In some embodiments, the haptic feedback is adapted to be based on, e.g., by means of the sensing module 510, sensing a length of the touch pattern or movement pattern, or a reference touch pattern or movement pattern, or a count of reference touch patterns or movement patterns.

In some embodiments, the haptic feedback is further adapted to be based on temperature and/or whether conditions.

In some embodiments, the haptic feedback is adapted to comprise a mechanical deformation of the responsive material structure 304.

In some embodiments, the context is arranged to comprise a software application running on the electronic device 110, 500, and/or a mode of the electronic device 110, 500.

In some embodiments the electronic device is further configured to, e.g., by means of the function-triggering module 530, trigger a first function in response to the mechanical switch actuator 301 being actuated, and further being configured to:

e.g., by means of the sensing module 510, sense a release of the mechanical switch actuator 301; and e.g., by means of the sensing module 510, sense a continued touch of the object with the electromagnetic sensor 302; and e.g., by means of the feedback module 520, generate the haptic feedback corresponding to the first function again in response to the continued touch; and e.g., by means of the function-triggering module 530, trigger the first function again in response to the sensing the continued touch.

In some embodiments the electromagnetic sensor 302 is arranged between the mechanical switch actuator 301 and the responsive material structure 304.

In some embodiments the electromagnetic sensor 302 is adapted to be a capacitive sensor.

In some embodiments the responsive material structure 304 for providing haptic feedback is one of an electroactive material structure, a photomechanical material structure and a heat activated material structure.

In some embodiments the electroactive material structure 304 comprises an electroactive polymer.

In some embodiments the electromagnetic sensor 302 is arranged to be at least partly not covered by a conductive material.

In some embodiments the electronic device 110, 500 is or comprises any of a mobile phone, a tablet, a TV, a monitor, a headset, electronic eyewear, an alarm clock, a car, or a music player.

The embodiments herein may be implemented through a processing circuit 504, e.g., comprising one or more processors, in the electronic device 110, 500 depicted in FIG. 5, together with computer program code, e.g., computer program 503, for performing the functions and actions of the embodiments herein. The program code mentioned above may also be provided as a computer program product, for instance in the form of a data carrier carrying computer program code for performing the embodiments herein when being loaded into the electronic device 110, 500. One such carrier may be in the form of a CD ROM disc. It is however feasible with other data carriers such as a memory stick. The computer program code may furthermore be provided as pure program code on a server and downloaded to the electronic device 110, 500.

The electronic device 110, 500 may further comprise a memory 502 comprising one or more memory units. The memory 502 comprises instructions executable by the processing circuit in the electronic device 110, 500. The memory 502 is arranged to be used to store e.g., information, indications, data, configurations, and applications to perform the methods herein when being executed in the electronic device 110, 500.

In some embodiments, a computer program 503 comprises instructions, which when executed by the processing circuit 504, cause the processing circuit 504 of the electronic device 110, 500 to perform any of the method actions above.

In some embodiments, a carrier 505 comprises the respective computer program 503, wherein the carrier 505 is one of an electronic signal, an optical signal, an electromagnetic signal, a magnetic signal, an electric signal, a radio signal, a microwave signal, or a computer-readable storage medium.

To perform the method actions above, the electronic device 110, 500 may comprise an Input and Output (I/O) unit 506. The I/O unit 506 may be part of a user interface and may comprise or be configured to communicate with e.g., the button 300, the mechanical switch actuator 301, the electromagnetic sensor 302 and the responsive material structure 304.

Those skilled in the art will appreciate that the modules and/or units in the electronic device 110, 500 described above may refer to a combination of analog and digital circuits, and/or one or more processors configured with software and/or firmware, e.g., stored in the electronic device 110, 500, that when executed by, e.g., the processing circuit 501, above causes the electronic device to perform the method actions above. The processing circuit 501, as well as the other digital hardware, may be included in a single Application-Specific Integrated Circuitry (ASIC), or several processors and various digital hardware may be distributed among several separate components, whether individually packaged or assembled into a system-on-a-chip (SoC).

As used herein, the term "module" may refer to one or more functional modules, each of which may be implemented as one or more hardware modules and/or one or more software modules and/or a combined software/hardware module. In some examples, the module may represent a functional unit realized as software and/or hardware.

As used herein, the term "computer program carrier", "program carrier", or "carrier", may refer to one of an electronic signal, an optical signal, a radio signal, and a computer readable medium. In some examples, the computer program carrier may exclude transitory, propagating signals, such as the electronic, optical and/or radio signal. Thus, in these examples, the computer program carrier may be a non-transitory carrier, such as a non-transitory computer readable medium.

As used herein, the term "processing module" may include one or more hardware modules, one or more software modules or a combination thereof. Any such module, be it a hardware, software or a combined hardware-software module, may be a connecting means, providing means, configuring means, responding means, disabling means or the like as disclosed herein. As an example, the expression "means" may be a module corresponding to the modules listed above in conjunction with the figures.

As used herein, the term "software module" may refer to a software application, a Dynamic Link Library (DLL), a software component, a software object, an object according to Component Object Model (COM), a software component, a software function, a software engine, an executable binary software file or the like.

The terms "processing module" or "processing circuit" may herein encompass a processing unit, comprising e.g., one or more processors, an Application Specific integrated Circuit (ASIC), a Field-Programmable Gate Array (FPGA) or the like. The processing circuit or the like may comprise one or more processor kernels.

As used herein, the expression "configured to/for" may mean that a processing circuit is configured to, such as adapted to or operative to, by means of software configuration and/or hardware configuration, perform one or more of the actions described herein.

As used herein, the term "action" may refer to an action, a step, an operation, a response, a reaction, an activity or the like. It shall be noted that an action herein may be split into two or more sub-actions as applicable. Moreover, also as applicable, it shall be noted that two or more of the actions described herein may be merged into a single action.

As used herein, the term "memory" may refer to a hard disk, a magnetic storage medium, a portable computer diskette or disc, flash memory, Random Access Memory (RAM) or the like. Furthermore, the term "memory" may refer to an internal register memory of a processor or the like.

As used herein, the term "computer readable medium" may be a Universal Serial Bus (USB) memory, a DVD-disc, a Blu-ray disc, a software module that is received as a stream of data, a Flash memory, a hard drive, a memory card, such as a MemoryStick, a Multimedia Card (MMC), Secure Digital (SD) card, etc. One or more of the aforementioned examples of computer readable medium may be provided as one or more computer program products.

As used herein, the term "computer readable code units" may be text of a computer program, parts of or an entire binary file representing a computer program in a compiled format or anything there between.

As used herein, the terms "number" and/or "value" may be any kind of number, such as binary, real, imaginary or rational number or the like. Moreover, "number" and/or "value" may be one or more characters, such as a letter or a string of letters. "Number" and/or "value" may also be represented by a string of bits, i.e., zeros and/or ones.

As used herein, the expression "in some embodiments" has been used to indicate that the features of the embodiment described may be combined with any other embodiment disclosed herein.

Even though embodiments of the various aspects have been described, many different alterations, modifications and the like thereof will become apparent for those skilled in the art. The described embodiments are therefore not intended to limit the scope of the present disclosure.

The invention claimed is:

1. An electronic device comprising a button for an electronic device, wherein the button comprises a mechanical switch actuator for triggering a function related to the button, an electromagnetic sensor for sensing touch and/or proximity of an object interacting with the button and a responsive material structure for providing haptic feedback to the object in response to sensing touch and/or proximity of the object, wherein the haptic feedback is associated with the function which is triggered by the mechanical switch actuator, and wherein the electronic device is configured to:

sense touch and/or proximity of an object with the electromagnetic sensor;

generate a haptic feedback with the responsive material structure in response to sensing the touch and/or proximity of the object, wherein the haptic feedback is associated with a function which is triggered by the mechanical switch actuator; and trigger the function in response to the mechanical switch actuator being actuated.

2. The electronic device according to claim 1, wherein the electromagnetic sensor is arranged between the mechanical switch actuator and the responsive material structure.

3. The electronic device according to claim 1, wherein the electromagnetic sensor is a capacitive sensor.

4. The electronic device according to claim 1, wherein the responsive material structure for providing haptic feedback is one of an electroactive material structure, a photomechanical material structure and a heat activated material structure.

5. The electronic device according to claim 4, wherein the electroactive material structure comprises an electroactive polymer.

6. The electronic device according to claim 1, wherein the electromagnetic sensor is at least partly not covered by a conductive material.

7. The electronic device according to claim 1, configured to perform:

adjusting an input parameter of the electronic device and wherein the haptic feedback is dependent on a value of the input parameter.

8. The electronic device according to claim 1, wherein the electronic device is any of a mobile phone, a tablet, a TV, a monitor, a headset, electronic eyewear, an alarm clock, a car, or an audio player.

9. A method, performed by an electronic device for triggering a function of the electronic device, wherein the electronic device comprises a button which comprises a mechanical switch actuator for triggering the function related to the button, an electromagnetic sensor for sensing touch and/or proximity of an object interacting with the button and a responsive material structure for providing haptic feedback to the object, the method comprising:

sensing touch and/or proximity of the object with the electromagnetic sensor;

generating a haptic feedback with the responsive material structure in response to sensing the touch and/or proximity of the object, wherein the haptic feedback is associated with the function which is triggered by the mechanical switch actuator; and triggering the function in response to the mechanical switch actuator being actuated.

10. The method according to claim 9, wherein the function comprises adjusting an input parameter of the electronic device and wherein the haptic feedback is dependent on a value of the input parameter.

11. The method according to claim 9, further comprising activating the responsive material structure and/or the electromagnetic sensor in response to sensing touch and/or proximity of the object with the electromagnetic sensor.

12. The method according to claim 9, further comprising de-activating the responsive material structure and/or the electromagnetic sensor in response to not sensing touch and/or proximity of the object with the electromagnetic sensor during a time period.

13. The method according to claim 9, wherein generating the haptic feedback is based on sensing a touch pattern or a movement pattern of the object with the electromagnetic sensor.

14. The method according to claim 9, wherein generating the haptic feedback is based on sensing a length of the touch pattern or the movement pattern, or a reference touch or movement pattern, or a count of reference touch patterns or movement patterns.

15. The method according to claim 9, wherein generating the haptic feedback is based on a context in which the electronic device is used.

16. The method according to claim 15, wherein the context comprises a software application running on the electronic device, and/or a mode of the electronic device.

17. The method according to claim 9, activating the responsive material structure and/or the electromagnetic sensor in response to sensing touch and/or proximity of the object with the electromagnetic sensor if the button is configured to trigger the function in the context in which the electronic device is used.

18. The method according to claim 9, wherein the haptic feedback is further based on temperature and/or whether conditions.

19. The method according to claim 9, wherein the haptic feedback comprises a mechanical deformation of the responsive material structure.

20. The method according to claim 9, wherein the electronic device triggers a first function in response to the mechanical switch actuator being actuated, and the method further comprises:

sensing a release of the mechanical switch actuator;

sensing a continued touch of the object with the electromagnetic sensor; and triggering the first function again in response to the sensing the continued touch.

21. A non-transitory computer readable medium comprising a computer program, comprising computer readable code that, when executed on an electronic device, causes the electronic device to perform a method for triggering a function of the electronic device, wherein the electronic device comprises a button that comprises a mechanical switch actuator for triggering the function related to the button, an electromagnetic sensor for sensing touch and/or proximity of an object interacting with the button and a responsive material structure for providing haptic feedback to the object, wherein the method comprises:

sensing touch and/or proximity of the object with the electromagnetic sensor;

generating a haptic feedback with the responsive material structure in response to sensing the touch and/or proximity of the object, wherein the haptic feedback is associated with the function which is triggered by the mechanical switch actuator; and triggering the function in response to the mechanical switch actuator being actuated.

* * * * *